(12) United States Patent
Smith

(10) Patent No.: US 7,961,542 B2
(45) Date of Patent: *Jun. 14, 2011

(54) METHODS, CIRCUITS, AND SYSTEMS TO SELECT MEMORY REGIONS

(76) Inventor: Scott Smith, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/581,747

(22) Filed: Oct. 19, 2009

(65) Prior Publication Data
US 2010/0034034 A1 Feb. 11, 2010

Related U.S. Application Data

(63) Continuation of application No. 11/805,092, filed on May 21, 2007, now Pat. No. 7,613,060.

(51) Int. Cl.
*G11C 7/00* (2006.01)

(52) U.S. Cl. ... 365/222; 365/200; 365/201; 365/230.03; 365/226; 365/227; 365/228; 365/229

(58) Field of Classification Search .................. 365/200, 365/201, 230.03, 222, 226–229
See application file for complete search history.

(56) References Cited

U.S. PATENT DOCUMENTS

| | | | |
|---|---|---|---|
| 5,200,922 A | 4/1993 | Rao | 365/185.09 |
| 5,822,257 A | 10/1998 | Ogawa | 365/200 |
| 5,991,218 A | 11/1999 | Kushiyama | 365/222 |
| 6,028,810 A | 2/2000 | Ooishi | 365/230.03 |
| 6,141,290 A | 10/2000 | Cowles | 365/230.06 |
| 6,166,980 A | 12/2000 | Chun | 365/222 |
| 6,188,617 B1 | 2/2001 | Goebel | 365/200 |
| 6,195,303 B1 | 2/2001 | Zheng | 365/222 |
| 6,304,499 B1 | 10/2001 | Pochmuller | 365/200 |
| 6,968,419 B1 | 11/2005 | Holman | 711/5 |
| 2002/0024858 A1 | 2/2002 | Hidaka | 365/200 |
| 2003/0021170 A1 | 1/2003 | Perner | 365/201 |
| 2003/0133333 A1 | 7/2003 | Eldredge et al. | 365/200 |
| 2003/0206470 A1 | 11/2003 | Leader et al. | 365/201 |
| 2004/0068604 A1 | 4/2004 | Le et al. | 711/5 |
| 2004/0179416 A1 | 9/2004 | Ikeda et al. | 365/222 |
| 2005/0060488 A1 | 3/2005 | Poechmueller | 711/106 |
| 2006/0152984 A1 | 7/2006 | Poechmueller | |

FOREIGN PATENT DOCUMENTS
KR 10-2006-0079646 7/2006

*Primary Examiner* — Huan Hoang
*Assistant Examiner* — Jay Radke
(74) *Attorney, Agent, or Firm* — Gazdzinski & Associates, PC

(57) ABSTRACT

Embodiments for selecting regions of memory are described. For example, in one embodiment a memory device having an array of memory cells includes an array selection block. The array selection block receives an input signal indicative of a region in the array of memory cells. The array selection block generates a selection signal to map the region to at least one physical location in the array of memory cells, based on the detection of the number of defects in that location.

15 Claims, 4 Drawing Sheets

METHODS, CIRCUITS, AND SYSTEMS TO SELECT MEMORY REGIONS

CROSS-REFERENCE TO RELATED APPLICATION

This application is a continuation of U.S. patent application Ser. No. 11/805,092, filed May 21, 2007. This application is incorporated by reference herein in its entirety and for all purposes.

TECHNICAL FIELD

Embodiments of the invention relate to integrated circuits, more particularly to selecting memory regions in memory devices such as to improve the performance of self refresh operations.

BACKGROUND OF THE INVENTION

A variety of operations are performed in memory devices, such as dynamic random access memory devices ("DRAM"), each of which affects the rate at which the memory device consumes power. One operation that tends to consume power at a substantial rate is the refresh of memory cells in the DRAM device. As is well-known in the art, DRAM memory cells, each of which essentially consists of a capacitor, must be periodically refreshed to retain data stored in the DRAM device. Refresh is typically performed by reading data bits from the memory cells in each row of a memory cell array and then writing those same data bits back to the same cells in the row. This refresh is generally performed on a row-by-row basis at a rate needed to keep charge stored in the memory cells from leaking excessively between refreshes. Since refresh essentially involves reading data bits from and writing data bits to a large number of memory cells, refresh tends to be a particularly power-hungry operation. Thus many attempts to reduce power consumption in DRAM devices have focused on reducing the rate at which power is consumed during refresh.

The amount of power consumed by refresh also depends on which of the several refresh modes is activated. A self refresh mode is normally activated to automatically refresh memory cells or selected memory cells during periods when data are not being read from or written to the DRAM device. Since portable electronic devices are often inactive for substantial periods of time, the amount of power consumed during self refresh can be an important factor in determining how long the electronic device can be used between battery charges.

Another approach to reducing the rate at which power is consumed by a refresh operation is to refresh less than all of the memory cells in the DRAM device by refreshing only those memory cells needed to store data for a given application. In one technique, a software program is executed in a computer system containing the DRAM devices, and is analyzed to determine the data storage requirements for the program. The DRAM device then refreshes only those rows of memory cells that are needed to store the program data. In another technique, the DRAM device may operate in a partial array self refresh ("PASR") mode. In the PASR mode, a mode register is programmed by a user to specify a region of memory cells that will be used and thus must be refreshed. The remaining memory cells are not used and thus need not be refreshed during at least some of the refresh modes. For example, the DRAM device may be partitioned into two regions, where one region contains critical data that is important to refresh and maintain, such as processor instructions, while the other region contains less critical data that can be lost if it is not refreshed, such as image data. Since processor instruction data is typically much smaller compared to image data, power consumption can be significantly reduced by refreshing only the region with the critical data.

Although the techniques for refreshing less than all of the memory cells can substantially reduce the rate of power consumption, it can nevertheless require a substantial amount of power to refresh the cells that are to be refreshed. Additionally, although a user is able to select a partial self-refresh mode instead of the full self-refresh mode to reduce the power consumption rate, the memory cells selected for the partial self-refresh are hardwired in the device at the time of manufacture and cannot be changed by the user. Therefore, if the selected partial self-refresh region contains inherent defects, another region of memory that can be more efficiently refreshed cannot be reselected. When a certain number of memory cells become defective such as, for example, as a result of a shorted memory cell capacitor, delays to the memory access may result due to the defective memory cell. The memory access must consequently be redirected to a different memory cell so that data will be accurately read from a DRAM. Redundant rows of memory cells are typically provided for this purpose. However, substantial additional circuitry must be provided to redirect memory accesses to redundant memory cells, which adds further delays to refresh operations.

There is therefore a need for an improved memory device, system and method, such as those that can be organized in a manner that allows, e.g., a user to custom select an optimal region of the memory device having the least number of defects to enable the best refresh rate.

DETAILED DESCRIPTION

The explicitly disclosed embodiments of the present invention are directed to, for example, improving the performance of self refresh operations in memory devices, systems and methods. Certain details are set forth below to provide a sufficient understanding of the embodiments of the invention. However, it will be clear to one skilled in the art that embodiments of the invention may be practiced without these particular details. In other instances, well-known circuits, circuit components, control signals, and timing protocols have not been shown in detail in order to avoid unnecessarily obscuring the embodiments of the invention.

Figure 1:
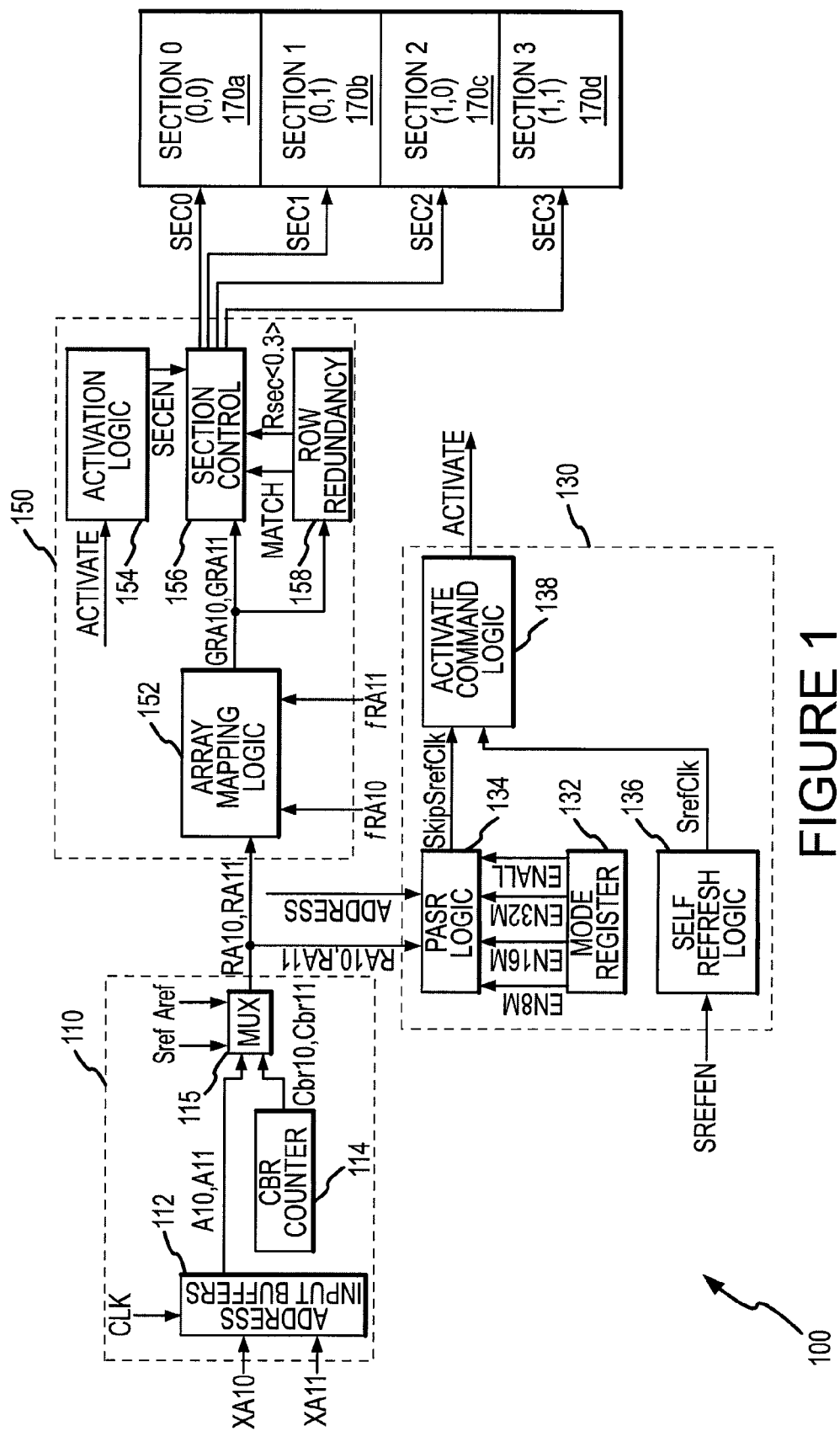
FIG. 1 is a block diagram of a memory device having an array selection block according to an embodiment of the invention.

FIG. 1 is a block diagram of a DRAM memory device 100 showing an array mapping logic module 152 for mapping regions of a memory array 170 according to an embodiment of the invention. The DRAM memory device 100 is shown in simplified form, it being understood that DRAM devices typically include a large number of other components, which have been omitted from FIG. 1 in the interests of brevity and clarity. The DRAM device 100 includes the memory array 170 divided into four regions, however, the DRAM device 100 may be divided into any number of regions depending on the type of device and type of application. For example, the memory array 170 may be a 128 megabyte (meg) device divided into four 32-meg regions, or it may be divided into eight 16-meg regions. Additionally, the size of the memory array 170 can vary. For example, the memory array 170 may be a 96-meg device divided into three 32-meg regions instead of four.

The DRAM device 100 includes an address register block 110 having address input buffers 112 configured (e.g., electrically coupled) to receive external address signals XA10, XA11 from an external address bus (not shown). In response to a clock signal CLK, the address input buffers 112 provide buffered internal address signals A10, A11 to the DRAM device 100 from corresponding external address signals XA10, XA11. The internal address signals A10, A11 correspond to a set of addresses that identify the rows to be refreshed in one of the regions of the memory described above. A row address multiplexer (mux) 115 receives the address signals A10, A11, and also receives either a self-refresh command signal SREF or an auto-refresh command signal AREF from a command decoder (not shown) or a controller (not shown) to place the DRAM device 100 in one of the two refresh modes. The self-refresh mode is used to retain data in the DRAM device 100 even while the system is powered down, which allows the DRAM device 100 to retain data without relying on an external clock. The auto-refresh mode is selected during normal operation, when the self-refresh mode is not selected. The combination of the self-refresh and auto-refresh modes ensures the entire chip stays refreshed over time. The mux 115 also receives count signals CBR10, CBR11 from a CAS Before RAS (CBR) counter 114 that counts through the range of addresses of each selected region of memory to track the next available address, and ensures every address is sequentially refreshed. The CBR counter 114 is incremented at the completion of each refresh activation, and thereby tracks the last refreshed row in order to select the next row address. In response to its input signals, the mux 115 generates array region address signals RA10, RA11, which identifies the regions having the memory cells corresponding to the externally received address signals XA10, XA11. The address signals RA10, RA11 are supplied to a refresh control block 130 and an array selection module, such as an array selection block 150 such that the appropriate selected regions of the memory array 170 are selected for refresh, as will be further described in detail. It will be understood that various components of the memory device 100 are referred to as a module where applicable. However, those ordinarily skilled in the art will appreciate that module is a general term that includes circuits, blocks of circuits, software, firmware, microcode, and so on.

To place the memory device 100 in the self refresh mode, a self refresh logic module 136 in the refresh control block 130 receives a self refresh enable signal SREFEN, and generates a SrefCLK signal about every 16 µs, which also initiates the SREF command signal applied to the mux 115. The SrefCLK signal is an internal command signal that is used to instruct an activate command logic module 138 to generate an ACTIVATE signal, which is another control signal used to refresh the selected row. As previously described, the refreshed row is then tracked by the CBR counter 114 in preparation for the next row to be refreshed. Once the DRAM device 100 is placed in the self refresh mode, responsive to the SREFEN signal, the DRAM device 100 will remain in the self-refresh mode until it is taken out of that mode responsive to an appropriate disable command. In the self-refresh mode, the entire memory array 170 can be refreshed or certain regions of the memory can be selected for refresh, such as by programming a mode register 132 to select one of several self refresh operations controlled by a partial array self refresh (PASR) logic module 134.

The PASR logic module 134 in the refresh control block 130 receives one of several mode signals from a mode register 132 that may be programmed to select regions of the memory array 170 or the entire array for refresh. For example, the mode register 132 may be programmed to refresh 8-megs, 16-megs, 32-megs or the entire array. In more particular detail, the mode register 132 may be used to generate one of the following corresponding enable signals EN8M, EN16M, EN32M or ENALL that is then applied to the PASR logic module 134. The PASR logic module 134 additionally receives the RA10, RA11 signals and the ADDRESS signals of the selected rows for refresh from the address register block 110. In response to both the mode enable signal from the mode register 132 and the address signals from the address register block 110, the PASR logic module 134 generates a SkipSrefCLK signal that is supplied to the activate command logic module 138. The SkipSrefCLK signal controls when to allow the SrefCLK signal to be used by the activate command logic module 138 to generate the ACTIVATE signal, depending on which of the regions of the memory array 170 has been selected in the self refresh mode or the partial array self refresh mode. For example, in response to the RA11, RA10 signals, if the SkipSrefCLK signal is low, then the activate command logic module 138 generates the ACTIVATE signal responsive to receiving an SrefCLK signal. If the SkipSrefCLK signal is high, then the incoming SrefCLK signal is ignored and the ACTIVATE signal is not generated, thereby bypassing the selected row for refresh. Regardless, the CBR counter 114 continues to increment its count for all received addresses so that the skipped addresses are counted and eventually passed back to be selected for refresh at a later time or in a different refresh mode.

A problem with the partial self-refresh mode in the prior art is that the region for partial refreshing was pre-selected and hardwired in the device 100 during manufacturing, as previously described. Determining what region of the memory array 170 is optimally suited to provide the best refresh and having the flexibility to reprogram the partial refresh to those regions, however, can be used to, for example, improve the refresh time and/or reliability of the stored data, and can reduce the rate of power consumption.

The address signals RA11, RA10 are additionally supplied to the array selection block 150, which then applies a corresponding select signal SEC0-SEC3 to select a region of the memory array 170 for activation. As previously discussed, regions of the memory array 170 can be custom selected for refresh in the partial array self refresh mode, such as after the device has been tested, to select the optimal regions of the memory array 170. Conventional memory tests, for example, may be used to determine the optimal regions of memory, such as those that result in the least occurrence of errors (due to defects) and the best refresh time. Fuse control signals fRA10 and fRA11 may be used by an array select mapping module 152 to control the mapping, e.g., selection of the optimal refresh regions of the memory array 170, such as based on the memory tests. The optimal regions of the memory array 170 may then be used, for example, to store critical data that requires high reliability storage. Having the flexibility to select the location of the optimal regions of the memory array 170 to be refreshed could, for example, improve the reliability of the stored data and require less frequent refresh operations, thereby reducing power consumption. The array mapping module 152 uses the fuse control signals fRA10, fRA11 to correlate the addresses RA10, RA11 to the physical location of the regions in the memory array 170 selected for optimal refresh, and are mapped, such as by generating mapping signals GRA10, GRA11. While the logical location of the areas of memory corresponding to address signals RA10, RA11 remains the same to the user, the actual location of the selected region may have been reassigned to a physically different region of the memory, as mapped by the signals GRA10, GRA11, such as to assign the best regions of memory for storage of high reliability data or for the best refresh. Therefore the array mapping module 152 is capable of making the physical location of the selected refresh region transparent to the user.

The mapping signals GRA10, GRA11 are received by a row redundancy module 158 and by a section control module 156. The redundancy module 158 allows malfunctioning memory cells in the memory array 170 to be replaced. As known in the art, testing is typically performed on the memory array 170 by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device 100. The defective memory cells may be replaced by enabling the redundant module 158. A malfunctioning memory cell in a column or a row is substituted with a corresponding redundant element, such as an entire column or row of redundant memory cells, respectively. Therefore, the memory device 100 need not be discarded even though it contains defective memory cells, and the redundant element associated with the matching address is accessed instead of the row or column having the defective memory cells. The redundancy module 158 generates a MATCH signal to indicate to the section control module 156 a matched redundancy element is activated to replace defective memory cells that are then deactivated. The redundancy module 158 also provides an address signal Rsec<0:3> to the section control module 156, which contains the location of the replacing redundancy element. The act of storing the critical data in the optimal regions of the memory array 170 after first testing the memory device 100 should reduce the reliance on redundancy elements since the region with the least occurrence of defects can be selected. Therefore, the additional power necessary to refresh redundancy elements in the redundancy module 158 can be minimized, if so desired.

The section control module 156 additionally receives a control signal SECEN from an activation logic module 154 to enable the section control module 156, such as enabling it for selection when the mapping signals GRA10, GRA11 are provided by the array mapping module 152. The activation logic 154 receives the ACTIVATE signal for selecting the regions to refresh from the activate command logic module 138. The activation logic 154 generates the SECEN signal after receiving the ACTIVATE signal and after a delay occurs so that the section control module 156 receives a control signal from the redundancy module 158, if required. Therefore, the activation logic 154 ensures the section control module 156 is only enabled after it has the opportunity to receive a signal from the redundancy module 158.

In summary, when the system is in the partial array self refresh mode, the memory device 100 receives external row address signals and may generate corresponding memory addresses that include the addressed rows of cells to be refreshed in the memory array 170. The addresses RA10, RA11 may have been mapped to optimal regions of the memory array 170, such as after memory testing. For example the original location in the memory array 170 may have been reassigned to a physically different location after testing, such as to select optimal regions of the memory array 170. If the externally received addresses correspond to regions RA10, RA11 that are to be refreshed in an active mode, then the row addresses are selected for refresh by the array selection block 150. If the externally received addresses do not correspond to the sections RA10, RA11 that are to be refreshed in the active mode, then the array selection block 150 bypasses the addressed rows so that they are not refreshed and power is not wasted by an unnecessary refresh operation. The memory device 100 receives the next external row address signals and so on, until all the rows of the sections RA10, RA11 that are to be refreshed in the active mode are refreshed. The array selection block 150 allows the selected rows for partial array self refresh to be reassigned to select the optimal regions of the memory array 170. The array selection block 150 can also enable the memory device 100 to select the regions of the memory array 170 having the highest reliability for storing critical data, and consequently select those regions that provide for optimal refresh. For example, selecting optimal regions of the memory array 170, after memory testing and for optimal refreshing showed a decrease in the periodic refresh rate from refreshing a row every 64 milliseconds, as known in the art, to every 128 milliseconds.

Figure 2:
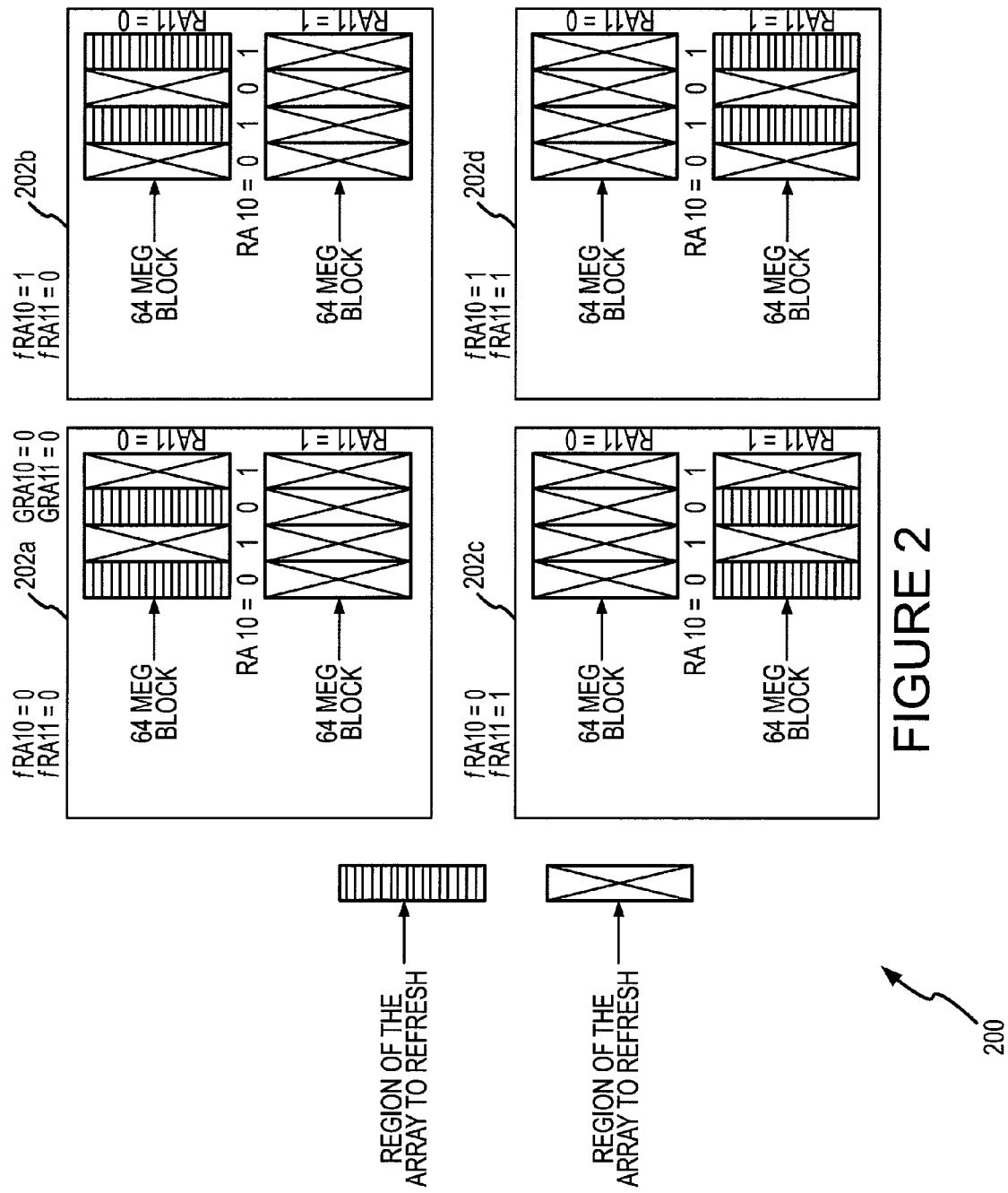
FIG. 2 is a diagram showing a map of the memory array regions that can be selected by the selection block of FIG. 1, according to an embodiment of the invention.

The size of one illustrative memory array 202 is 128-megs, which can be viewed as comprising two blocks of 64-megs each partitioned into four 16-meg regions. It will be understood that the memory array 202 may be of a different size and may be partitioned in other ways as previously described. An example of a memory map 200 is shown in FIG. 2, where memory array selections 202a-d are displayed for the memory array 202. Each of the four possible selections includes two 64-meg blocks vertically labeled RA11=0 and RA11=1, respectively. Each of the 64-meg blocks are further partitioned into horizontal sub-sections labeled RA10=0 RA10=1, as previously described. Using the RA11 value as the y-coordinate and the RA10 value as the x-coordinate, the memory array 202 may be divided into four 32-meg regions labeled (0, 0), (0, 1), (1, 0) or (1, 1).

As previously described, two fuse signals fRA10, fRA11 can be used by the array mapping module 152 to correlate one of four different 32-meg regions as shown by the memory array selections 202a-d in the memory map 200, and to assign a region identified by the received RA10, RA11 signals. Each of the fuse signals are used to correspond to a fuse having a logic state 0 or 1, to derive the combinations 00, 01, 10 or 11, each corresponding to one of four memory array selections 202a-d, respectively. For example, the 32-meg region corresponding to RA10=0 and RA11=0 illustrated in the first memory array selection 202a (as indicated by the pattern of horizontal lines in that selection 202a) may be selected to correlate to a received RA10, RA11 signal by programming the fuse signals fRA10 and fRA11 as "0"s. The inverse is the case in the fourth memory array selection 202d, where the fuses fRA10=1 and fRA11=1 selects the 32-meg region RA10=1 and RA11=1. Meanwhile, programming the fuses fRA10 and fRA11 as "1"s could be used to select the 32 meg region identified in selection 202d.

Figure 3:
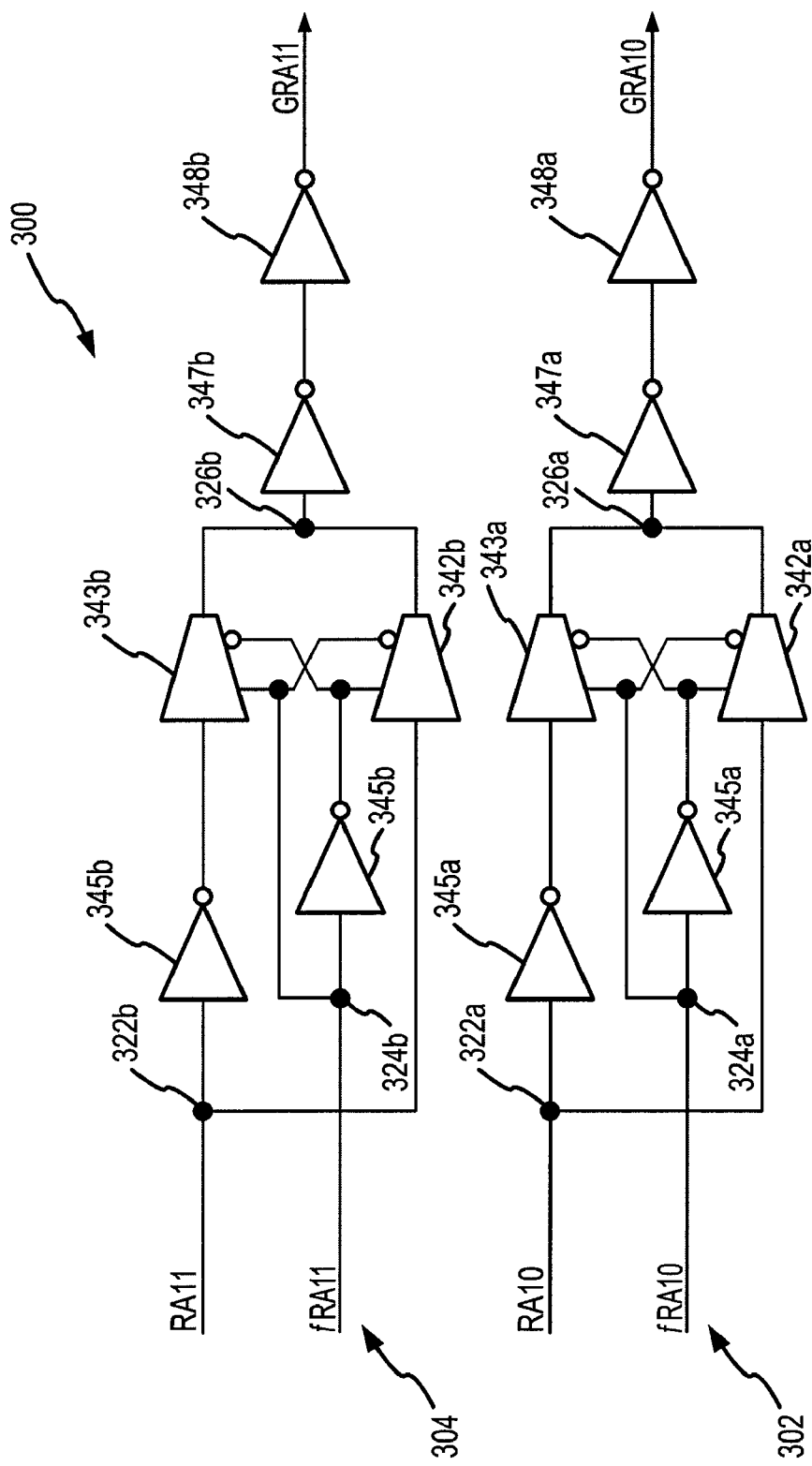
FIG. 3 is a schematic drawing of a mapping module that maps regions of the memory array for refresh, according to an embodiment of the invention.

FIG. 3 shows a schematic of an array mapping module 300, similar to the array mapping module 152 of FIG. 1. The array mapping module 300 can be used to program the fuses fRA10, fRA11 to correlate regions of the memory array in accordance with embodiments of the invention. As previously described, the array mapping module 300 receives the address signals RA10, RA11 from the address register 110, and also receives the fuse signals fRA10, fRA11, such as after the memory device 100 has been tested and the optimal regions of the memory array 170 have been identified. Substantially identical logic circuits 302, 304 are included in the array mapping module 300, each of which generating a mapping signal corresponding to received signals RA10 and RA11. The signal RA10 and fuse signal fRA10 are received as inputs to the first logic circuit 302 at nodes 322a, 324a, respectively. The RA10 input signal may be provided directly to a first transfer gate 342a, which operates as multiplexer controlled by the received fRA10 input signal, and to an inverter 345a to provide an inverted RA10 signal to a second transfer gate 343a, which is also controlled by the fRA10 signal. One of the transfer gates 342a, 343a is enabled depending on which region of the memory is selected by the fRA10 signal. The output of the enabled transfer gate 342a or, 343a at a node 326a is then provided to the input of two inverters 347a, 348a to drive the received signal out as a mapping signal GRA10. The mapping signal GRA10 is then used by the section control module 156 of FIG. 1 to select a region of the memory corresponding to a received address, such as for refresh as previously described.

The logic circuit 304 includes the same components as the logic circuit 302, except for the inputs to the logic circuit 304 are the signal RA11 and corresponding fuse signal fRA11. The logic circuit 304 function in the same manner as the logic circuit 302 to generate the second mapping signal GRA11, and in the interest of brevity, the second logic circuit 304 will not be described.

In summary, the array mapping module 300 can be used to address signals to memory array regions RA10, RA11 to a different optimized physical region of the memory array 170, 202, such as ones previously selected by the fuse signals fRA10, fRA11. In this manner, the array mapping module 300 allows the physical assignment of the selected memory region to be transparent to the user, but allows for improved memory operations, such conserving power during partial self-refresh. Therefore, regions of the memory for partial array self-refresh do not necessarily need to be programmed or hardwired at the time of manufacture. Instead, more optimal regions of the memory may be programmed for partial array self-refresh at a later time, for example after memory testing. These optimal regions, such as those having better refresh characteristics may then be used to store more critical data such as software and code, as previously described.

Figure 4:
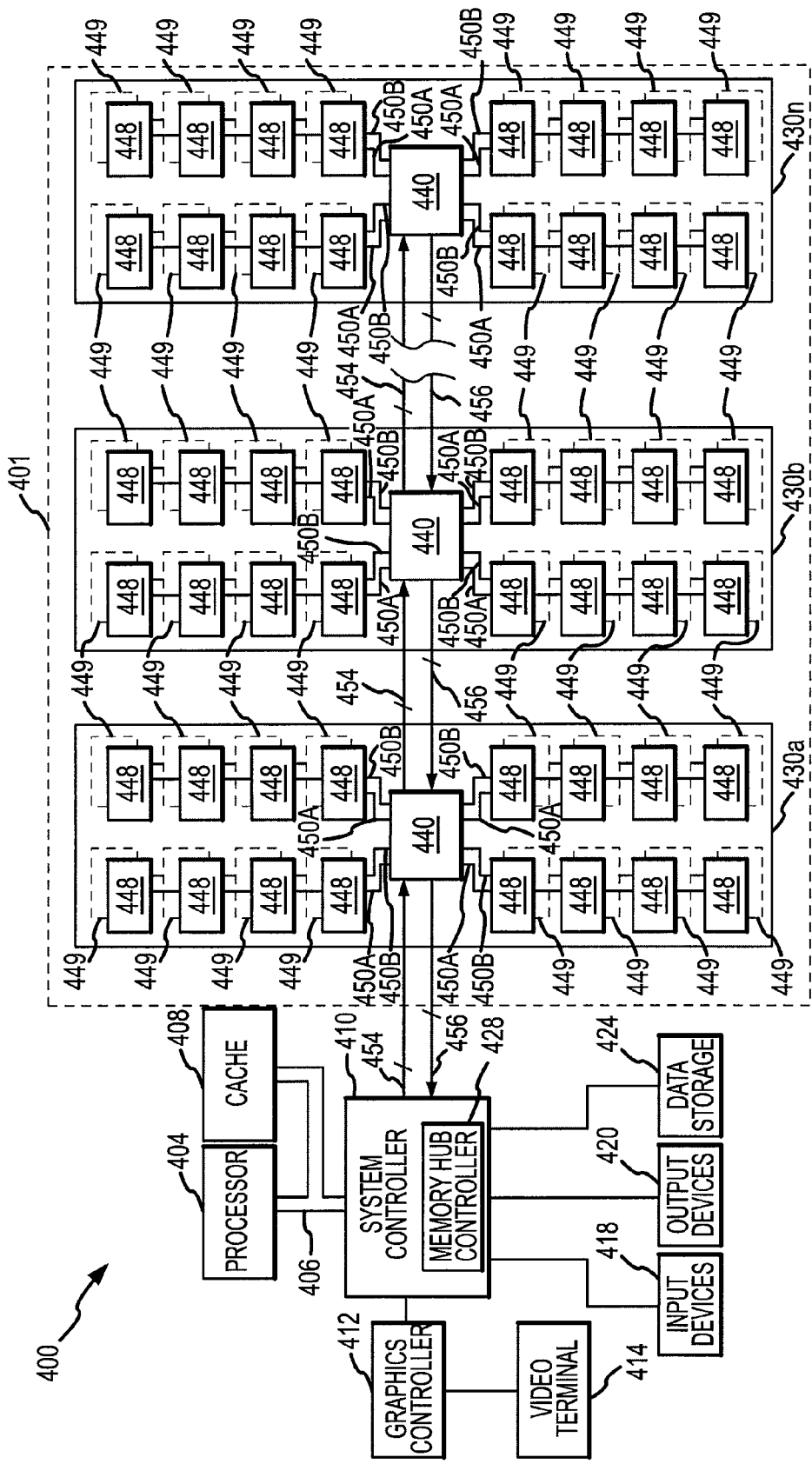
FIG. 4 is a block diagram of a processor-based system having a selection block according to another embodiment of the invention.

FIG. 4 illustrates a computer system 400 having a memory hub architecture in which embodiments of the present invention can be alternatively utilized. The computer system 400 includes a processor 404 for performing various computing functions, such as executing specific software to perform specific calculations or tasks. The processor 404 includes a processor bus 406 that normally includes an address bus, a control bus, and a data bus. The processor bus 406 is typically in communication with (e.g. coupled to) cache memory 408, which is, typically static random access memory ("SRAM"). The processor bus 406 is further coupled to a system controller 410, which is also referred to as a bus bridge.

The system controller 410 also serves as a communications path to the processor 404 for a variety of other components. More specifically, the system controller 410 includes a graphics port that is typically coupled to a graphics controller 412, which is, in turn, coupled to a video terminal 414. The system controller 410 is also coupled to one or more input devices 418, such as a keyboard or a mouse, to allow an operator to interface with the computer system 400. Typically, the computer system 400 also includes one or more output devices 420, such as a printer, coupled to the processor 404 through the system controller 410. One or more data storage devices 424 are also typically coupled to the processor 404 through the system controller 410 to allow the processor 404 to store data or retrieve data from internal or external storage media (not shown). Examples of typical storage devices 424 include hard and floppy disks, tape cassettes, and compact disk read-only memories (CD-ROMs).

The system controller 410 contains a memory hub controller 428 coupled to several memory modules 430a-n through a bus system 454, 456. Each of the memory modules 430a-n includes a memory hub 440 coupled to several memory devices 448, 449 through command, address and data buses, collectively shown as bus 450a, 450b. The memory hub 440 efficiently routes memory requests and responses between the controller 428 and the memory devices 448, 449. The memory devices 448, 449 can be the memory device 100 previously described with respect to FIG. 1. Each of the memory hubs 440 includes write buffers and read data buffers. Computer systems employing this architecture allow for the processor 404 to access one memory module 430a-n while another memory module 430a-n is responding to a prior memory request. For example, the processor 404 can output write data to one of the memory modules 430a-n in the system while another memory module 430a-n in the system is preparing to provide read data to the processor 404. Additionally, a memory hub architecture can also provide greatly increased memory capacity in computer systems.

Embodiments of the present invention can be utilized in the memory devices 448, 449, the memory hub controller 428, or the memory hub 440 in each memory module 430a-n. If the array mapping module 300 of FIG. 3 is utilized in each of the memory devices 448, 449, the memory arrays of each device may be optimized to store critical data in the regions of the device having the best refresh times as previously described. Alternatively, the array mapping module 300 may be utilized in the memory hub 440 of each memory module 430, where a group of memory devices 448, 449 having optimal performance may be selected to the store critical data or to be self-refreshed. Similarly, if the array mapping module 300 is utilized by the memory hub controller 428, the array mapping module 300 may be configured to select the optimal group of memory modules 430, and so on.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A memory module comprising:
a plurality of memory devices; and
a memory hub configured to receive memory requests corresponding to a first region of one or more of the plurality of memory devices, the memory hub operable to communicate the memory requests to the one or more of the plurality of memory devices and transmit memory data from the one or more of the plurality of memory devices in response to at least one of the memory requests; and
a selection block configured to receive the memory requests corresponding to the first region of one or more of the plurality of memory devices and to receive an input signal indicating a number of defective cells that are replaced by redundant cells in at least one region of one or more of the plurality of memory devices selectable by the selection block relative to that of at least another region of the one or more of the plurality of memory devices selectable by the selection block, the selection block operable to map the memory requests to a second region of the one or more of the plurality of memory devices based on the input signal.

2. A processor-based system comprising:
a processing apparatus operable to process data and to provide memory commands and addresses;
a system controller in communication with the processing apparatus, the system controller operable to receive and transmit memory commands, addresses and data;
a plurality of memory devices in communication with the system controller, each of the plurality of memory devices operable to receive memory commands, addresses, and write data for storage in at least one of the memory devices, and to transmit read data from the memory devices to the system controller; and
a selection block configured to receive an address signal indicative of a region of memory devices, the selection block being operable to generate a selection signal to map the address signal indicative of the region of memory devices to a physical location of the plurality of memory devices, the selection block further being operable to generate the selection signal on the basis of the number of defective cells that are replaced by redundant cells in the physical location of the plurality of memory devices relative to that of at least one other region selectable by the selection block.

3. A memory device comprising:
a plurality of memory cells organized logically in a plurality of rows and partitioned into a plurality of individually selectable regions, each region comprising at least a portion of said plurality of rows; and
a row selection block in communication with the plurality of rows and configured to receive an address signal indicative of a first region of the plurality of regions, individually selectable by the row selection block;
wherein the row selection block is operable to generate a selection signal based at least in part on an identification of a number of defective cells that are replaced by redundant cells in the first region relative to a number of defective cells of a second region of the plurality of regions selectable by the row selection block.

4. The memory device of claim 3, wherein the selection signal is configured to reduce a delay in accessing memory location selected by the address signal.

5. The memory device of claim 3, wherein the row selection block is further configured to generate the selection signal based at least in part on a signal indicating a match between at least a portion of the address signal and a predetermined address location, the predetermined address location related to a defective memory cell.

6. The memory device of claim 5, wherein the row selection block further comprises an activation module operable to generate a control signal to select a memory location within the second region of the plurality of regions responsive to the signal indicating a match.

7. The memory device of claim 3 further comprising a refresh control block in communication with the array selection block, the refresh control block operable to assign a region of the memory cells to be refreshed in response to the selection of a partial array self-refresh mode.

8. The memory device of claim 7, wherein:
the refresh control block further comprises activate command logic; and
the row selection block further comprises an activation module in communication with the activate command logic, the activation module operable to enable a selection of the selected memory cells responsive to receiving a control signal from the activate command logic.

9. A memory device having a plurality of memory cells logically partitioned into a plurality of individually selectable regions, the memory device comprising:
an address register block configured to receive external address signals and operable to generate internal address signals corresponding to the external address signals; and
a selection block in communication with the address register block and configured to effect selection of the plurality of individually selectable regions;
wherein:
the selection block is configured to receive the internal address signals and an input signal indicating a plurality of defective cells that are replaced by redundant cells in at least a first region of the plurality of regions selectable by the selection block relative to that of at least a second region of the plurality of regions selectable by the selection block; and
the selection block is operable to map the internal address signals to a physical location within the plurality of memory cells based at least in part on the input signal.

10. The memory device of claim 9, wherein the selection block is further configured to generate a selection signal based at least in part on a signal indicating a match between at least a portion of the address signal and a predetermined address location, the predetermined address location related to a defective memory cell.

11. The memory device of claim 10, wherein the selection block farther comprises an activation module operable to generate a control signal to select an memory location within the second region of the plurality of regions responsive to the match signal.

12. The memory device of claim 9, wherein the selection block is operable to map the internal address signals to a physical location within the plurality of memory cells based on a refresh characteristic.

13. The memory device of claim 9, further comprising a refresh control block in communication with the address register block and configured to receive the internal address signals, the refresh control block operable to generate a control signal to select memory cells at the physical location to be refreshed in a partial array self-refresh mode.

14. The memory device of claim 13, wherein the selection block further comprises an activation module, the activation module being operable to enable a selection of the selected memory cells responsive to receiving the control signal from the refresh control block.

15. The memory device of claim 14, wherein the refresh characteristic comprise a time between refresh that is double the standard time between refresh.

* * * * *